United States Patent [19]

Mogi et al.

[11] 4,262,341
[45] Apr. 14, 1981

[54] MEMORY CIRCUIT

[75] Inventors: Jun-ichi Mogi, Kawasaki; Kiyoshi Miyasaka, Yokohama; Fumio Baba, Yokohama; Tsutomu Mezawa, Yokohama, all of Japan

[73] Assignee: Fujitsu Limited, Kawasaki, Japan

[21] Appl. No.: 952,334

[22] Filed: Oct. 18, 1978

[30] Foreign Application Priority Data

Oct. 18, 1977 [JP] Japan ................... 52-124704

[51] Int. Cl.³ ............................................. G11C 7/06
[52] U.S. Cl. ............................ 365/205; 307/DIG. 3; 365/207
[58] Field of Search ............... 365/205, 202, 203, 207, 365/208; 307/DIG. 3

[56] References Cited

U.S. PATENT DOCUMENTS 4,061,999  12/1977  Proebsting et al. ............... 365/182
4,166,225  8/1979   Minkov et al. ...................... 365/205

OTHER PUBLICATIONS

Gray, Bit Line Restore Shorting Technique, IBM Tech. Disc. Bul., vol. 20, No. 5, 10/77, pp. 1714–1715.

Primary Examiner—Stuart N. Hecker
Attorney, Agent, or Firm—Staas and Halsey

[57] ABSTRACT

Disclosed is the addition of a capacitor circuit for augumenting the voltages at predetermined points in a sense amplifying circuit, in order to ensure a satisfactory refreshing of memory cells, since, if the potentials at the connecting points between a sense amplifying circuit and bit lines fall below a predetermined value when the sense amplifying circuit is caused to operate, it is difficult to achieve a complete refreshing of the memory cells.

17 Claims, 4 Drawing Figures

MEMORY CIRCUIT

BACKGROUND OF THE INVENTION

1. Field of the Invention

The present invention relates to a memory circuit, and more particularly to an integrated-circuit type memory circuit having bit lines, memory cells and sense amplifying circuits.

2. Description of the Prior Art

As is well known, an integrated-circuit type memory circuit is used together with sense amplifying circuits. An example of prior art integrated-circuit type memory circuits comprising sense amplifying circuits is explained hereinafter with reference to FIG. 1. This embodiment is disclosed in U.S. Pat. No. 4,061,999.

Memory cells m1, m2, ... mn and a dummy cell d' are connected to a bit line BL1. Memory cells m'1, m'2, ... m'n and a dummy cell d are connected to another bit line BL2. The memory cell m1 comprises a memory capacitor C1 and a field effect transistor Q-m1 (FET Q-m1). The FET Q-m1 is controlled through a word line W1. The dummy cell d comprises a dummy capacitor $C_{sa}$, a parallel connected FET Q-d1 and a series connected FET Q-d2. The series connected FET Q-d2 is controlled through a dummy word line DWA. The capacitance of the dummy capacitor $C_{sa}$ is approximately one half of the capacitance of the memory capacitor.

Each of the bit lines BL1 and BL2 is connected to a sense amplifying circuit SA-1. The sense amplifying circuit SA-1 includes a pair of connecting FETs $Q_1$ and $Q_2$ through which the sense amplifying circuit SA-1 is connected to the bit lines BL1 and BL2. The main part of the sense amplifying circuit SA-1 consists of a pair of cross-coupled FETs $Q_3$ and $Q_4$.

A memory group No. 1 is connected to a pair of bus lines RL1 and RL2 through FETs $Q_x$ and $Q_y$. The bus lines RL1 and RL2 are connected to a differential amplifier D.A. which produces an output which is to be used as an output of the entire memory circuit of FIG. 1.

A controlling circuit X-1 for controlling the gate potential of the connecting FETs $Q_1$ and $Q_2$ is connected to the sense amplifying circuit SA-1.

The circuit of FIG. 1 is operated as follows. In the initial state, the potentials of the bit line BL1, the bit line BL2, the point P1 and the point P2 are equal to the drain supply voltage +E. The potential of the point P3 is arranged (explained below) to be higher than the voltage +E so that the FETs $Q_1$ and $Q_2$ are caused to be conductive. Voltages E-C1 and E-C1' are stored in memory capacitors C1 and C1', respectively.

Under the above-described initial state, the reading out of information stored in the memory circuit is effected as follows. It is assumed that the word line W1 is selected and is caused to become HIGH level. Simultaneously, the dummy cell d is selected and the word line DWA of the dummy cell d is rendered HIGH level. Thus, the electric charges of BL1 and BL2 are transferred to P5 and P8, respectively, so that the potentials of BL1 and BL2 are reduced. Since the potential E-C1 was at HIGH level before the reading-out, the amount of transfer of electric charge from BL1 to P5 is small. On the other hand, since the potential at P8 is rendered zero before the dummy cell d is selected, the amount of transfer of electric charge from BL2 to P8 is relatively large. Accordingly, the potential of BL2 is reduced more than the potential of BL1 is reduced. Thus, a potential difference is formed between BL1 and BL2. The potentials of BL1 and BL2 are transmitted to the points P1 and P2 through FETS $Q_1$ to $Q_2$. Accordingly, the potential at P1 is caused to be higher than the potential at P2.

After that, the potential $\phi_1$ at an electrode of the capacitor $C_o$, included in the controlling circuit X-1 for controlling the connecting FETs $Q_1$ and $Q_2$, is made HIGH level. Then, FET $Q_a$ is rendered ON because the gate potential of FET $Q_a$ becomes sufficiently higher than +E, and the potential at P3 goes down to the level of +E. Accordingly, the transconductances of FETs $Q_1$ and $Q_2$ are reduced. The potential $\phi_1$ at an electrode of the capacitor $C_o$ is also applied to the gate of FET $Q_5'$ included in the sense amplifying circuit. The sensitivity of the sense amplifying circuit SA-1 is preliminarily increased by the operation of FET $Q_5'$ with a small current before the large scale amplification of an input signal is conducted by the sense amplifying circuit. Thus, when FET $Q_5'$ turns ON due to the application of the potential $\phi_1$ to the gate thereof, the operation of the sense amplifying circuit SA-1 is started slowly, the potentials at the points P1 and P2 are together caused to go down, and the potential difference between P1 and P2 is caused to increase.

At this moment, the potential $\phi_2$ of the gate of FET $Q_5$ is rendered HIGH level. Then the potential at P4 becomes quickly zero, and the flip-flop circuit consisting of FETs $Q_3$ and $Q_4$ conducts its operation so that the potential difference between P1 and P2 is enlarged.

In the sense amplifying circuit SA-1, FETs $Q_1$ and $Q_2$ are provided. The necessity for the FETs $Q_1$ and $Q_2$ can be explained as follows. In the initial period of the operation of the sense amplifying circuit, the transconductances of FETS $Q_1$ and $Q_2$ are small and FETs $Q_1$ and $Q_2$ prevent the flow of the charges of BL1 and BL2 to the points P1 and P2, so that the potential difference between P1 and P2 is amplified quickly, and accordingly, the drop of the potential of BL1, which should be maintained at HIGH level, is prevented. If FETs $Q_1$ and $Q_2$ were eliminated and the bit lines BL1 and BL2 were connected directly to the points P1 and P2, the charge in the load capacitances of the bit lines BL1 and BL2 would be discharged through FETs $Q_3$ and $Q_4$ when the sense amplifying circuit is operated. Thus, the speed of the amplification of the potential difference between P1 and P2 would be low, so that it would take a long time for the potential at P2, which should be brought to LOW level, to reach ground level and the charges of BL1, which for refreshing the charge state of m1 should be brought to the HIGH level, would be discharged. Thus, the potential of BL1 would be lowered and accordingly the complete refreshing of the HIGH levels of the memory cells would not be effected.

Returning to the description of the enlargement of the potential difference between P1 and P2, in the case where the potential difference between P1 and P2 is small, both of the potentials at P1 and P2 are reduced to a great extent because both of the FETs $Q_3$ and $Q_4$ become ON and the difference in transconductance is not very large. When the potentials at P1 and P2 are reduced as described above, the transconductances of FETs $Q_1$ and $Q_2$ are increased and the cutting-off abilities of FETs $Q_1$ and $Q_2$ are decreased. Thus, FETs $Q_1$ and $Q_2$ are caused to be ON, so that the flow of charges from the bit lines BL1 and BL2 through FET $Q_1$ and $Q_2$ prevents the further enlargement of the potential difference between P1 and P2. In consequence, even if the sense amplifying circuit detects exactly the signal applied thereto and the potential at P2 is rendered zero in accordance with the initial potential difference, the potential at P1 unavoidably falls lower than a required level. Such a fall of the potential at P1 makes it impossible to refresh the memory cells from which the stored information has been read out. In addition, such a difficulty in refreshing memory cells occurs more prominently in the case where the initial potentials at P1 and P2 are lowered due to the decrease of voltage of the power source. Accordingly, the prior art memory circuit shown in FIG. 1 involves the disadvantage explained above.

SUMMARY OF THE INVENTION

It is an object of the present invention to provide an integrated circuit type memory circuit having memory cells, FETs and sense amplifying circuits to enable the refreshing of said memory cells.

It is another object of the present invention to provide an integrated circuit type memory circuit having memory cells, FETs and sense amplifying circuits in which the voltage conditions at predetermined points in said memory circuit are selected so as to enable refreshing of said memory cells.

DESCRIPTION OF THE PEFERRED EMBODIMENT

Figure 3:
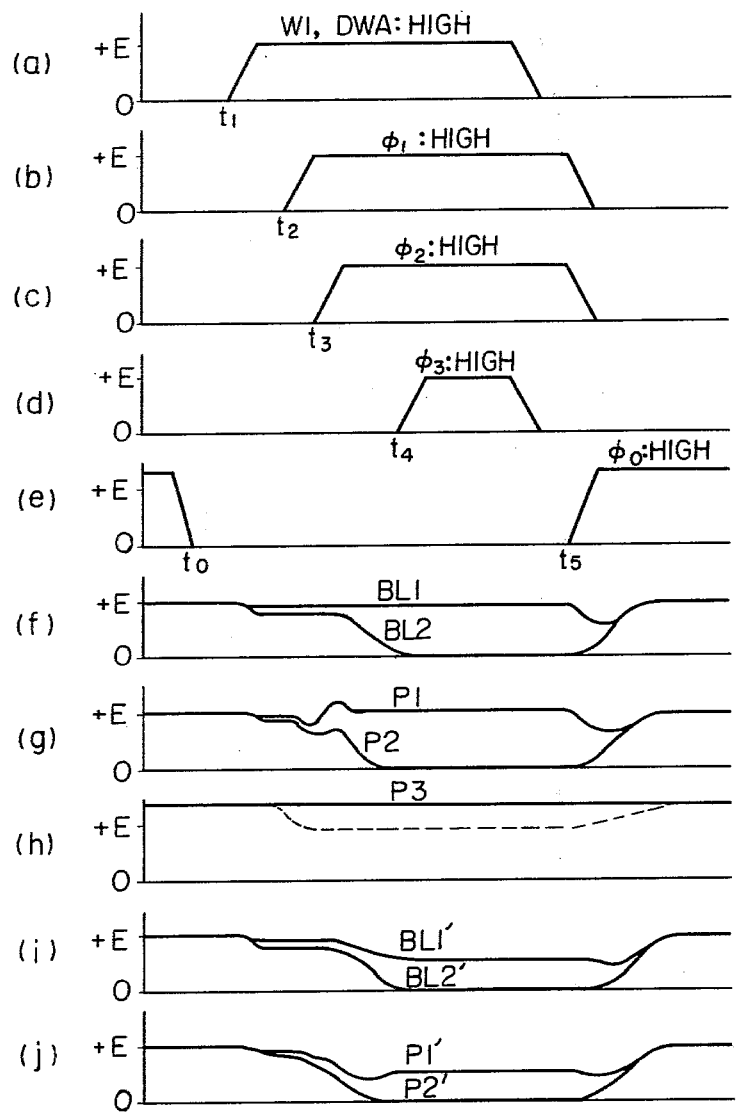
FIG. 3 consisting of FIGS. a–j is an illustration of wave forms which indicate the operating characteristics of the circuit of FIG. 2.
Figure 4:
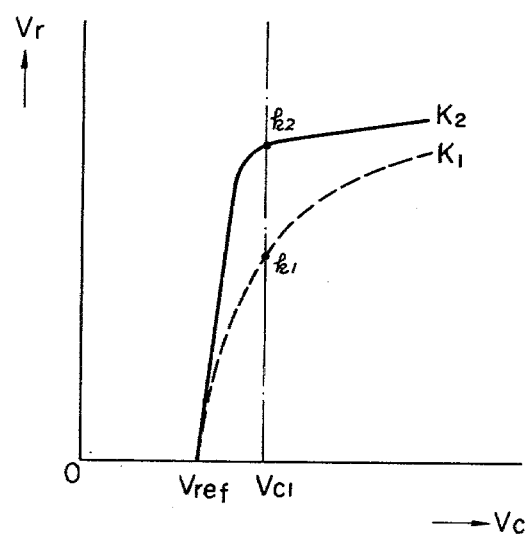
FIG. 4 shows the relationship between $V_c$ and $V_r$ in connection with experiments conducted by the inventors.

The preferred embodiment of the present invention will be described hereinafter with reference to FIGS. 2, 3 and 4.

Figure 1:
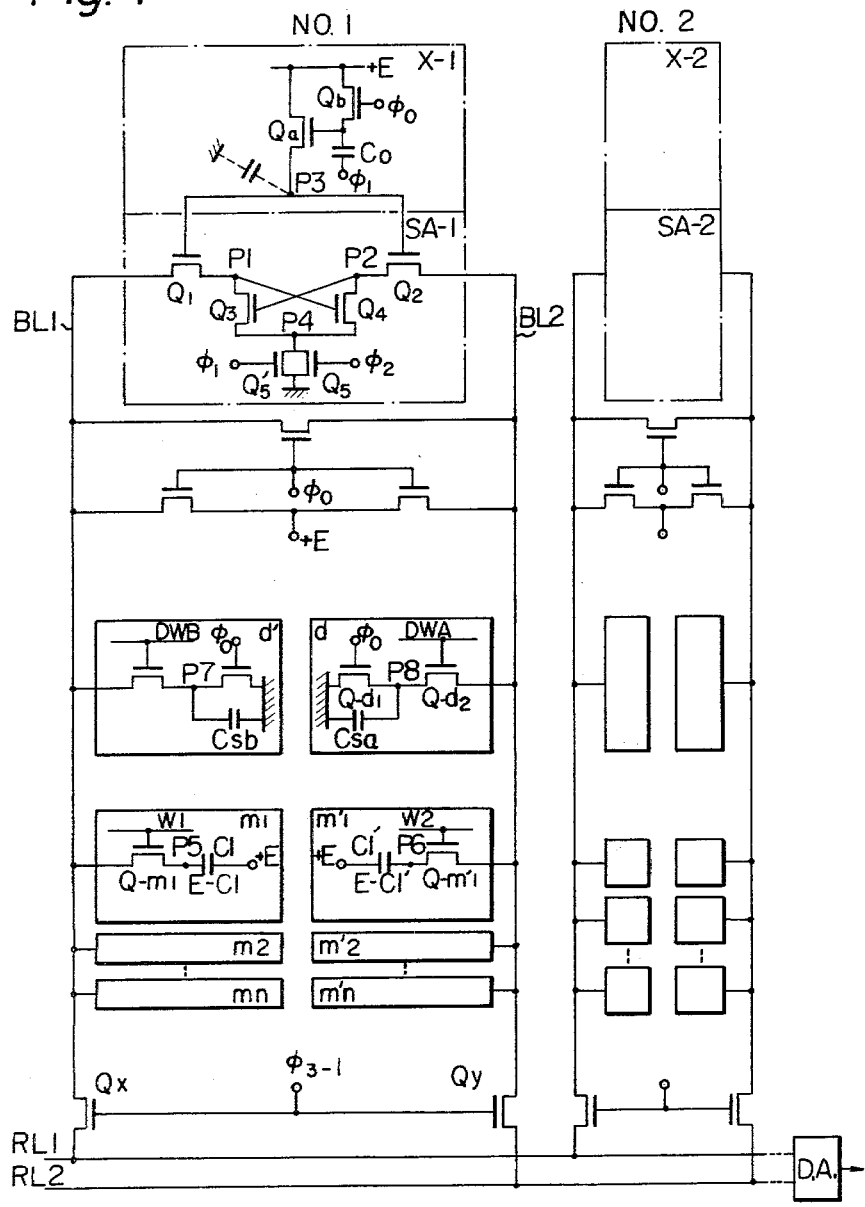
FIG. 1 is a schematic circuit diagram of a prior art memory circuit having a sense amplifying circuit.
Figure 2:
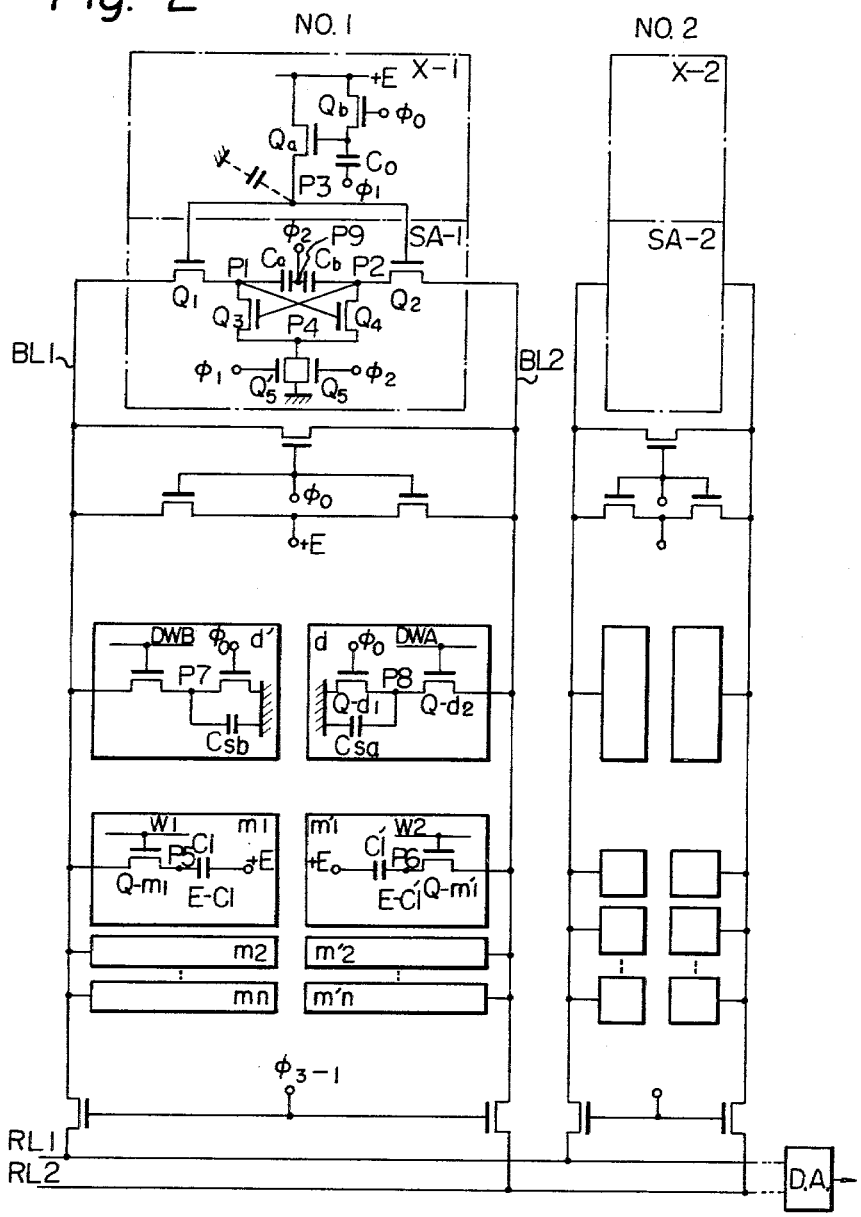
FIG. 2 is a schematic circuit diagram of a memory circuit according to an embodiment of the present invention.

The memory circuit in accordance with an embodiment of the present invention is illustrated in FIG. 2. Unit No. 1 of the memory circuits comprises a pair of bit lines BL1 and BL2, a plurality of memory cells m1, m2, ... mn, a pair of dummy cells d', d, and a sense amplifying circuit SA-1, containing the connecting FETs $Q_1$ and $Q_2$, which are arranged between the bit lines BL1, BL2 and FETs $Q_3$, $Q_4$. Unlike the circuit of FIG. 1, a pair of capacitors $C_a$ and $C_b$ is provided in the circuit of FIG. 2. One of the electrodes of each of the capacitors $C_a$ and $C_b$ is connected either to the point P1 or P2 and the other electrodes of the capacitors $C_a$ and $C_b$ are connected together at the point P9. The points P1 and P2 are the connecting points between FET $Q_1$ and FET $Q_3$, and between FET $Q_2$ and FET $Q_3$, respectively. To the connecting point P9 of the capacitors $C_a$ and $C_b$ a driving pulse $\phi_2$ can be applied while a pair of FETs $Q_3$ and $Q_4$ is in operation.

The operation of the circuit of FIG. 2 is hereinafter described with reference to the wave forms of FIG. 3.

At the time $t_0$ (FIG. 3(e)), the potential $\phi_0$ is changed from HIGH level to LOW level to realize an initial condition. At that time, all of the circuits are rendered ready for operation, the bit lines BL1 and BL2 are pecharged with a voltage close to the drain supply voltage $+E$, and the voltage at the point P3 is arranged (as discussed below) to be higher than $+E$, making FETs $Q_1$ and $Q_2$ ready for conduction.

The read-out and the refreshment of the memory cell m1 can be explained as follows.

It is again assumed that the stored potential E-C1 is high level. At the time $t_1$, (FIG. 3(a)), the word line W1 and the dummy line DWA are selected by a decoding circuit (not shown in FIG. 2) to be brought to HIGH level. As a result, the potential of BL1 is lowered a little, the potential of BL2 is further lowered (FIG. 3(f)) and the potential of P1 is slightly higher than that of P2 (FIG. 3(g)).

At the time $t_2$ (FIG. 3(b)), the potential $\phi_1$ is changed from LOW level to HIGH level. As a result, FET$_5'$ is rendered ON the sense amplifying circuit SA-1 slowly starts to operate, the potentials at P1 and P2 fall together, and the potential difference between P1 and P2 is enlarged (FIG. 3(g)).

At the time $t_3$, immediately after the time $t_2$ (FIG. 3(c)), the potential $\phi_2$ is changed from low level to HIGH level. As a result, in accordance with the bootstrap effects of the capacitors $C_a$ and $C_b$, the potentials at the points P1 and P2 are not only prevented from falling but are pushed up (FIG. 3(g)). Thus, the connecting FETS $Q_1$ and $Q_2$ remain OFF. Accordingly the sense amplifying circuit is prevented from incorrect operation. Therefore, even when the potential of the point P2 falls to zero, the potential of the point P1 is maintained at nearly $+E$ and the potential of the bit line BL1 is prevented from falling (FIG. 3(f)). Accordingly, a sufficient refreshing of the memory cell m1 is attainable.

When the potential of the point P2 becomes zero, the FET $Q_2$ is rendered ON, so that the bit line BL2 is discharged through FET $Q_2$ and the potential of the bit line BL2 is brought to zero.

At the time $t_4$ (FIG. 3(d)), the selection signal $\phi_3$-1 which is supplied to select memory unit No. 1 is changed from LOW level to HIGH level. As a result, the signal existing on the bit lines BL1 and BL2 is transferred to the bus lines RL1 and RL2, which are led to a differential amplifier D.A., which produces a read-out output.

As a comparison with the prior art, the changes of the potentials of BL1 and BL2 and the changes of the potentials of P1 and P2 are shown in FIG. 3(i) and FIG. 3(j), respectively. It will be observed that, with the wave forms of FIGS. 3(i) and (j), sufficient refreshing of the memory cell m1 is impossible, because the potential of BL1 is greatly reduced.

As a modification of the above-described embodiment, the FETs $Q_1$ and $Q_2$ can be rendered OFF either by selecting the value of the potential at the point P3 or by lowering the potential at the point P3, as shown in a broken line in FIG. 3(h) by the aid of the circuit X-1. In this modified embodiment, the effects of the capacitors $C_a$ and $C_b$ are emphasized so that, even in the case where the potential difference between the points P1 and P2 is small just before the operation of the sense amplifying circuit, the potential of the bit line BL1 is prevented from falling and a perfect refreshing of the memory cell m1 is achieved.

The operation of the above-mentioned circuit X-1 is as follows. At the time an operation of the sense amplifying circuit is finished, one of the bit lines BL1 and BL2 is HIGH level and the other is LOW level, the voltage at the point P3 is +E and the FET $Q_a$ is ON. After that, the potential $\phi_0$ becomes HIGH level to bring all of the circuits into initial condition. Then, the potential $\phi_0$ becomes LOW state, which makes the FET $Q_a$ OFF and causes the potential of P3 to be in a floating state, and the LOW level bit line mentioned above is turned to HIGH level. This change from LOW level to HIGH level affects the potential of P3 which is in a floating state to push up the potential at P3 over +E. As a result, the FETs $Q_1$ and $Q_2$ are rendered ON, provided that the value of the stray capacity at the point P3 is an appropriate one. At the time the sense amplifying circuit operates, the potential $\phi_1$ is kept HIGH level. Thus, the gate voltage of FET $Q_a$ becomes higher than +E, so that the FET $Q_a$ is rendered ON and the potential at P3 is lowered to +E.

Although in the above described embodiments, the signal applied to the connecting point P9 of the capacitors $C_a$ and $C_b$ is $\phi_2$, it is also possible to apply to the point P9 the signal $\phi_1$ instead of the signal $\phi_2$. In the case where the signal $\phi_1$ is applied to the point P9, the above explained effects due to the existence of the capacitors $C_a$ and $C_b$ are a little reduced. This is because the potentials at P1 and P2 rise earlier in accordance with the bootstrap effects of $C_a$ and $C_b$ than the potential at P3 falls to +E, due to the delay caused by the circuit X-1, and accordingly, the charges at the points P1 and P2 leak to the bit lines BL1 and BL2 through FETs $Q_1$ and $Q_2$. However, this leak of charges is not serious. This is because the amount of charges removed from the points P1 and P2 to the bit lines BL1 and BL2 is relatively small, due to low transconductances of FETs $Q_1$ and $Q_2$ under the condition that the bit lines BL1 and BL2 are both HIGH level even where the potential of the point P3 is HIGH level.

One of the results of experiments regarding the memory circuit of FIG. 2 conducted by the inventors of the present invention will now be explained with reference to FIG. 4. In FIG. 4, the abscissa represents the voltage $V_c$ of a memory cell before the reading-out of said memory cell is effected, while the ordinate represents the refreshed voltage $V_r$ of said memory cell after the reading-out and the refreshment of said memory cell is effected. The curve $K_1$ is obtained by the circuit of FIG. 1, while the curve $K_2$ is obtained by the circuit of FIG. 2. In the abscissa, the reference voltage, which defines a boundary between LOW level and HIGH level, is indicated as $V_{ref}$. In the case where $V_c$ is selected close to $V_{ref}$ as $V_{cl}$, the corresponding $V_r$ in $K_1$, which is indicated as $k_1$, is considerably lower than maximum $V_r$ value along $K_1$, while the corresponding $V_r$ in $K_2$, which is indicated as $k_2$, is slightly reduced from the maximum $V_r$ value along $K_2$. The results of this experiment proved that the refreshed voltage $k_1$ on the curve $K_1$ is not enough to ensure the next reading-out of the same memory cell; while, on the contrary, the refreshed voltage $k_2$ on the curve $K_2$ is sufficient to ensure a satisfactory next reading-out of the same memory cell.

Although preferred embodiments of the present invention have been described above, it is to be understood that various changes, substitutions and alterations can be made thereto without departing from the spirit of the invention as defined by the appended claims.

What is claimed is:

1. A memory circuit allowing for the storing and reading out of data selectively corresponding to HIGH and LOW levels in selected memory cells and for rapid refreshing of said HIGH levels after said read out, said memory circuit comprising
   a pair of bit lines,
   a plurality of memory cells connected to said bit lines, each said memory cell comprising means for storing said data in correspondence to charged and discharged states,
   a sense amplifying circuit selectively connected for sensing said data stored in said memory cells, said sense amplifying circuit comprising a pair of cross-coupled transistors, the gate of each said cross-coupled transistor being connected to a respective terminal of the other, and a pair of capacitors connected in series between said respective terminals of said cross-coupled transistors,
   a pair of connecting transistors each connecting through source and drain electrodes thereof between a respective one of said bit lines and a respective one of said respective terminals of said cross-coupled transistors, the gates of said connecting transistors being connected in common, and
   means for shutting off the connecting transistors during said sensing of said stored data for said rapid refreshing of said HIGH level memory cells by selectively raising the potentials of the terminals of said connecting transistors that are respectively connected to said respective terminals of said cross-coupled transistors, said means comprising first means for providing a first pulse ($\phi_2$) to the common connection point between said series connected pair of capacitors.

2. The memory circuit of claim 1, said first means providing said first pulse ($\phi_2$) in a manner for maintaining the potential on said bit lines in correspondence to said data stored in said memory cells so that the status of those of said memory cells in said charged state are prevented from falling to a point that prevents the rapid refreshing of said charged status.

3. The memory circuit of claim 2, said first means providing said first pulse ($\phi_2$) in a manner for selectively cutting off said connecting transistors.

4. The memory circuit of claim 1 comprising a drain supply voltage for said cross-coupled transistors, and means for precharging said bit lines to a voltage approximately equal to the level of said drain supply voltage by means of precharge transistors connected directly to said bit lines.

5. The memory circuit of claim 4 comprising means for raising the voltages of the gates of said connecting transistors higher than said pre-charged voltage of said bit lines during selected portions of said reading-out of said stored data.

6. The memory circuit of claim 5 comprising a control circuit for lowering the voltage of the gates of said connecting transistors to a voltage close to said pre-charged voltage of said bit lines selectively during said reading out of said stored date.

7. The memory circuit of claim 6, said control circuit comprising at least a first control capacitor and a first control transistor, said first control capacitor being connected to the gate of said first control transistor.

8. The memory circuit of claim 7, said sense amplifying circuit comprising a pair of parallel-connected transistors connected between ground and the terminals of said cross-coupled transistors not connected to said gates of said cross-coupled transistors and means for applying said first pulse ($\phi_2$) and a second pulse ($\phi_0$) to respective gates of said parallel-connected transistors.

9. The memory circuit of claim 8 comprising means for applying said second pulse ($\phi_1$) to the terminal of said first control capacitor not connected to said gate of said first control transistor in said control circuit.

10. In a memory circuit for selectively storing data in the form of charge in a plurality of memory cells, for selectively reading out said stored data, and for rapidly restoring memory cells having said stored charge, said memory circuit comprising a pair of bit lines selectively connected to said memory cells, a pair of connecting transistors connected respectively to said bit lines, a sense amplifier connected to said pair of bit lines through said connecting transistors, a control circuit connected to the gates of said connecting transistors, said sense amplifier comprising a pair of cross-coupled transistors respectively connected between said connecting transistors at a first pair of terminal points and to ground through at least a fifth transistor connected in parallel to a second pair of terminal points of said cross-coupled transistors, each said pair of connecting transistors being connected through source and drain electrodes thereof between a respective one of said bit lines and a respective one of said first pair of terminals of said cross-coupled transistors, the improvement comprising
   a pair of capacitors connected in series between said first pair of terminal points of said cross-coupled transistors,
   a first means, for selectively applying a first voltage pulse ($\phi_2$) to the common point between said series connected capacitors for shutting-off the connecting transistors by raising the potential of the terminals of said connecting transistors that are respectively connected to said first pair of terminals of said cross-coupled transistors upon application of said first voltage pulse to the connecting point of said pair of capacitors, said rapid shut off providing for said rapid refreshing, and for selectively maintaining the voltage of said bit lines for allowing the refreshing of said stored charge of said memory cells selected for said sensing, and
   said gates of said connecting transistors being connected in common to said control circuit.

11. The improved memory circuit of claim 10, said control circuit comprising second means for raising the voltages on said gates of said connecting transistors for said shutting-off of said connecting transistors.

12. The improved memory circuit of claim 11, said control circuit and said second means comprising selective means for applying a drain supply voltage to said gates of said connecting transistors and for floating said gates at a higher potential than said drain supply voltage, during said reading out and refreshing of said selected memory cells.

13. The improved memory circuit of claim 12, said control circuit comprising a seventh transistor connected between said gates of said connecting transistors and said drain supply voltage, an eighth transistor connected between said drain supply voltage and the gate of said seventh transistor, a capacitor connected to said gate of said seventh transistor, and means for selectively applying second and third pulses respectively to the gate of said eighth transistor and through said capacitor to said gate of said seventh transistor.

14. The improved memory circuit of claim 10, said cross-coupled transistors being connected to ground through two parallel-connected transistors comprising said fifth and sixth transistors, and means for applying a fourth and fifth voltage pulses respectively to the two gates of said two parallel-connected transistors.

15. The improved memory circuit of claim 14, said third pulse being identical to said fourth pulse ($\phi_1$), said first pulse being identical to said fifth pulse ($\phi_2$), said second pulse going to a low value from a high value during said sensing and then returning to a high value, said first ($\phi_2$) and third ($\phi_1$) pulses having a high value only while said second pulse ($\phi_0$) has a low value, and said third pulse ($\phi_1$) not having a low value while said first pulse ($\phi_2$) has a high value.

16. The improved memory circuit of claim 15, comprising means for applying said drain supply voltage to said bit lines after said sensing, in conjunction with said means for floating said gates of said connecting transistors, to produce a voltage at the gates of said connecting transistors that is higher than said drain supply voltage.

17. The improved circuit of claim 15 said means for providing said pulses resulting in said first pulse ($\phi_2$) being identical to said third pulse. ($\phi_1$).

* * * * *

UNITED STATES PATENT AND TRADEMARK OFFICE
CERTIFICATE OF CORRECTION

PATENT NO. : 4,262,341
DATED : April 14, 1981
INVENTOR(S) : Jun-ichi Mogi et al.

It is certified that error appears in the above—identified patent and that said Letters Patent is hereby corrected as shown below:

Front page, item [57] Abstract, line 1, "augu-" should be
    --aug- --.
Column 1, line 16, "4,.061,999" should be --4,061,999--;
         line 29, "pacitor." should be --pacitor Cl.--.
Column 2, line 4, "to" should be --and--;
         line 36, "FETS" should be --FETs--;
         line 68, "FET" should be --FETs--.
Column 3, line 35, after "3" insert --,--; "$\underline{a}$-$\underline{j}$" should be
    --($\underline{a}$)-($\underline{j}$),--.
Column 4, line 7, "refreshment" should be --refreshing--;
         line 18, "$FET_5$'" should be --$FET\ Q_5$,--;
         line 24, "low" should be --LOW--;
         line 29, after "Accordingly" insert --,--;
         line 41, after "$\phi_3$-1" insert --,--;
         line 42, after "No. 1" insert --,--.
Column 5, line 5, "Then," should be --Meanwhile,--;
         line 6, "$\phi_0$" should be --$\phi_1$--;
         line 19, "above described" should be --above-
    described--;

UNITED STATES PATENT AND TRADEMARK OFFICE
CERTIFICATE OF CORRECTION

PATENT NO. : 4,262,341

DATED : April 14, 1981

INVENTOR(S) : Jun-ichi Mogi et al.

It is certified that error appears in the above—identified patent and that said Letters Patent is hereby corrected as shown below:

line 24, "above explained" should be --above-explained--;

line 45, "refreshment" should be --refreshing--;

line 51, "$V_{cl}$," (letter L) should be --$V_{c1}$,--.

Column 6, line 59, "date" should be --data--.

Column 7, line 4, "$(\phi_1)$" should be --$(\phi_0)$--;

line 33, "shutting-off" should be --shutting off--.

Column 8, line 4, "shutting-off" should be --shutting off--;

line 17, before "capacitor" insert --third--;

line 19, after "second" insert --$(\phi_0)$--; after "third" insert --$(\phi_1)$--;

line 20, after "said" (second occurrence) insert -- third --.

line 25, after "applying" delete "a".

Signed and Sealed this

Thirteenth Day of October 1981

[SEAL]

Attest:

GERALD J. MOSSINGHOFF

*Attesting Officer*     *Commissioner of Patents and Trademarks*